(12) United States Patent
Gambino et al.

(10) Patent No.: US 9,312,426 B2
(45) Date of Patent: Apr. 12, 2016

(54) STRUCTURE WITH A METAL SILICIDE TRANSPARENT CONDUCTIVE ELECTRODE AND A METHOD OF FORMING THE STRUCTURE

(75) Inventors: Jeffrey P. Gambino, Westford, VT (US); Derrick Liu, Winooski, VT (US); Daniel S. Vanslette, Fairfax, VT (US)

(73) Assignee: International Business Machines Corporation, Armonk, NY (US)

( * ) Notice: Subject to any disclaimer, the term of this patent is extended or adjusted under 35 U.S.C. 154(b) by 1099 days.

(21) Appl. No.: 13/313,101

(22) Filed: Dec. 7, 2011

(65) Prior Publication Data

US 2013/0146335 A1 Jun. 13, 2013

(51) Int. Cl.
*H05K 1/09* (2006.01)
*B05D 5/12* (2006.01)
(Continued)

(52) U.S. Cl.
CPC ............ *H01L 31/1884* (2013.01); *B82Y 10/00* (2013.01); *H01L 31/022408* (2013.01); *H01L 31/022425* (2013.01); *H01L 31/022466* (2013.01); *H01L 33/005* (2013.01); *H01L 33/42* (2013.01); *H01L 51/0021* (2013.01); *B82Y 30/00* (2013.01); *H01B 1/24* (2013.01); *H05K 3/105* (2013.01); *H05K 2201/0108* (2013.01); *H05K 2201/026* (2013.01); *H05K 2203/1194* (2013.01); *Y02E 10/50* (2013.01)

(58) Field of Classification Search
CPC ................. H01L 31/1884; H01B 1/24; H05K 2201/026; H05K 2203/1194; H05K 3/105; H05K 2201/0108
USPC ........................................................ 174/255
See application file for complete search history.

(56) References Cited

U.S. PATENT DOCUMENTS 5,151,385 A 9/1992 Yamamoto et al.
7,135,728 B2 11/2006 Duan et al.
(Continued)

FOREIGN PATENT DOCUMENTS

GB 2442768 A 4/2008

OTHER PUBLICATIONS

C.J. Kim et al., "Spontaneous Chemical Vapor Growth of NiSi Nanowires and Their Metallic Properties," Advanced Materials, vol. 19, 2007, pp. 3637-3642.
(Continued)

*Primary Examiner* — Hoa C Nguyen
*Assistant Examiner* — Amol Patel
(74) *Attorney, Agent, or Firm* — Gibb & Riley, LLC

(57) ABSTRACT

Disclosed are embodiments of a structure with a metal silicide transparent conductive electrode, which is commercially viable, robust and safe to use and, thus, optimal for incorporation into devices, such as flat panel displays, touch panels, solar cells, light emitting diodes (LEDs), organic optoelectronic devices, etc. Specifically, the structure can comprise a substrate (e.g., a glass or plastic substrate) and a transparent conducting film on that substrate. The transparent conducting film can comprise a metal silicide nanowire network. For example, in one embodiment, the metal silicide nanowire network can comprise multiple metal silicide nanowires fused together in a disorderly arrangement so that they form a mesh. In another embodiment, the metal silicide nanowire network can comprise multiple metal silicide nanowires patterned so that they form a grid. Also disclosed herein are various different method embodiments for forming such a structure.

15 Claims, 13 Drawing Sheets

(51) Int. Cl.
*B82Y 99/00* (2011.01)
*H01L 31/18* (2006.01)
*H01L 31/0224* (2006.01)
*H01L 33/00* (2010.01)
*H01L 33/42* (2010.01)
*H01L 51/00* (2006.01)
*B82Y 10/00* (2011.01)
*B82Y 30/00* (2011.01)
*H01B 1/24* (2006.01)
*H05K 3/10* (2006.01)

(56) References Cited

U.S. PATENT DOCUMENTS

| | | | |
|---|---|---|---|
| 7,633,148 B2 | 12/2009 | Awano et al. | |
| 7,718,995 B2 | 5/2010 | Kawashima et al. | |
| 7,977,761 B2 | 7/2011 | Kabir | |
| 8,269,108 B2 * | 9/2012 | Kunishi et al. | 174/113 R |
| 2005/0250276 A1 | 11/2005 | Heath et al. | |
| 2006/0086626 A1 | 4/2006 | Joyce | |
| 2009/0129004 A1 * | 5/2009 | Gruner | 361/679.21 |
| 2009/0188697 A1 | 7/2009 | Guiheen et al. | |
| 2010/0060602 A1 * | 3/2010 | Agari et al. | 345/173 |
| 2010/0087013 A1 | 4/2010 | Lieber et al. | |
| 2011/0180133 A1 | 7/2011 | Verhaverbeke et al. | |
| 2011/0186804 A1 | 8/2011 | Khayyat et al. | |
| 2011/0281070 A1 * | 11/2011 | Mittal et al. | 428/142 |
| 2012/0127097 A1 * | 5/2012 | Gaynor et al. | 345/173 |
| 2012/0241192 A1 * | 9/2012 | Cai et al. | 174/126.2 |

OTHER PUBLICATIONS

Wu et al., "Electrospun Metal Nanofiber Webs as High-Performance Transparent Electrode," American Chemical Society, Nano Letters, vol. 10, 2010, pp. 4242-4248.
H. Kim et al., "Indium Tin Oxide Thin Films for Organic Light-Emitting Devices," Applied Physics Letters, vol. 74, No. 23, 1999, pp. 3444-3446.
E. C. Garnett et. al, J. Am. Chem. 130, 9224-9225.
N. A. Melosh et. al, Science. 300, 113 (2003).
Sukanta De et al., "Silver Nanowire Networks as Flexible, Transparent, Conducting Films: Extremely High DC to Optical Conductivity Ratios", http://pubs.acs.org/doi/abs/10.1021/nn900348c, Abstract, Nov. 29, 2011.
David Hecht et al., "Carbon-Nanotube Film on Plastic as Transparent Electrode for Resistive Touch Screens", Journal of the SID, Nov. 17, 2009, pp. 941-946.
E. Bucher et al., "Work Function and Barrier Heights of Transition Metal Silicides", Appl. Phys. A40, 1986 pp. 71-77.

* cited by examiner

US 9,312,426 B2

STRUCTURE WITH A METAL SILICIDE TRANSPARENT CONDUCTIVE ELECTRODE AND A METHOD OF FORMING THE STRUCTURE

BACKGROUND

1. Field of the Invention

The embodiments disclosed herein relate to transparent conductive electrodes and, more particularly, to a structure with a metal silicide transparent conductive electrode and a method of forming the structure.

2. Description of the Related Art

Transparent conductive electrodes (also referred to herein as transparent conducting films (TCFs)) are films that are both optically transparent allowing transmittance of, for example, 80% or more of incident light and electrically conductive. Those skilled in the art will recognize that transparent conductive electrodes are often incorporated into modern devices, such as flat panel displays, touch panels, solar cells, light emitting diodes (LEDs), organic optoelectronic devices, etc. Currently, the material of choice for these electrodes is Indium Tin Oxide (ITO). Unfortunately, Indium is relatively rare, making its use cost prohibitive in light of the global demand for transparent conductive electrodes. Additionally, transparent conductive electrodes formed from Indium may be overly brittle and toxic. Therefore, there is a need in the art for a transparent conductive electrode structure and method of forming the structure that is more commercially viable, robust and safe to use.

SUMMARY

Disclosed herein are embodiments of a structure with a metal silicide transparent conductive electrode, which is commercially viable, robust and safe to use (i.e., non-toxic) and, thus, optimal for incorporation into modern devices, such as flat panel displays, touch panels, solar cells, light emitting diodes (LEDs), organic optoelectronic devices, etc. Specifically, the structure can comprise a substrate (e.g., a glass or plastic substrate) and a transparent conducting film (i.e., a transparent conducting electrode) on that substrate. The transparent conducting film can be made up of a metal silicide nanowire network. For example, in one embodiment, the metal silicide nanowire network can comprise multiple metal silicide nanowires fused together in a disorderly arrangement on the substrate. In another embodiment, the metal silicide nanowire network can comprise multiple metal silicide nanowires fused together in a grid on the substrate.

Also disclosed herein are method embodiments for forming such a structure. Specifically, the methods can comprise providing a substrate and forming a metal silicide nanowire network for a transparent conducting film on that substrate.

In one embodiment the metal silicide nanowire network can be formed such that it comprises multiple metal silicide nanowires fused together in a disorderly arrangement on the substrate. Specifically, this metal silicide nanowire network can be formed by: applying a solution that contains silicon nanowires onto the substrate; forming a metal layer on the silicon nanowires; and performing a silicidation anneal. Alternatively, the metal silicide network can be formed by: forming a metal layer on the substrate; applying a solution that contains silicon nanowires onto the metal layer; and performing a silicidation anneal. Alternatively, the metal silicide network can be formed by: applying a solution that contains metal nanowires onto the substrate; forming a silicon layer on the metal nanowires; and performing a silicidation anneal. Alternatively, the metal silicide network can be formed by: forming a silicon layer on the substrate; applying a solution that contains metal nanowires onto the silicon layer; and performing a silicidation anneal. In any case, after the silicidation anneal is performed, any unreacted silicon or metal can be selectively removed.

In another embodiment the metal silicide nanowire network can be formed such that it comprises multiple metal silicide nanowires fused together in a grid on the substrate. Specifically, this metal silicide nanowire network can be formed by: forming a metal layer on the substrate; printing a first set of multiple parallel silicon nanowires on the metal layer; printing a second set of multiple parallel silicon nanowires on the metal layer over the first set of multiple parallel silicon nanowires such that the first set is perpendicular to the second set; and performing a silicidation anneal. Alternatively, this metal silicide nanowire network can be formed by: printing a first set of multiple parallel silicon nanowires on the substrate; printing a second set of multiple parallel silicon nanowires on the substrate over the first set of multiple parallel silicon nanowires such that the first set is perpendicular to the second set; forming a metal layer over the first set and the second set; and performing a silicidation anneal. Alternatively, this metal silicide nanowire network can be formed by forming a silicide layer on the substrate; printing a first set of multiple parallel metal nanowires on the silicon layer; printing a second set of multiple parallel metal nanowires on the silicon layer over the first set of multiple parallel metal nanowires such that the first set is perpendicular to the second set; and performing a silicidation anneal. Alternatively, this metal silicide nanowire network can be formed by: printing a first set of multiple parallel metal nanowires on the substrate; printing a second set of multiple parallel metal nanowires on the substrate over the first set of multiple parallel metal nanowires such that the first set is perpendicular to the second set; forming a silicon layer over the first set and the second set; and performing a silicidation anneal. In any case, after the silicidation anneal is performed, any unreacted metal or unreacted silicon can be selectively removed.

BRIEF DESCRIPTION OF THE DRAWINGS

The embodiments herein will be better understood from the following detailed description with reference to the drawings, which are not necessarily drawn to scale and in which.

DETAILED DESCRIPTION

Figure 1A:
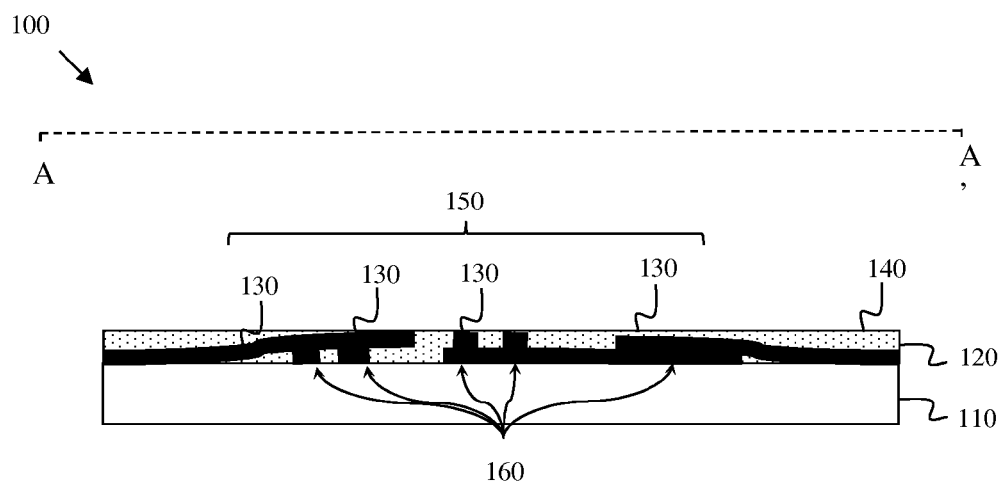
FIG. 1A is a cross-section diagram illustrating an embodiment of a structure with a metal silicide transparent conducting electrode.

As mentioned above, transparent conductive electrodes (also referred to herein as transparent conducting films (TCFs)) are films that are both optically transparent allowing transmittance of, for example, 80% or more of incident light and electrically conductive. Those skilled in the art will recognize that transparent conductive electrodes are often incorporated into modern devices, such as flat panel displays, touch panels, solar cells, light emitting diodes (LEDs), organic optoelectronics, etc. Currently, the material of choice for these electrodes is Indium Tin Oxide (ITO). Unfortunately, Indium is relatively rare, making it use cost prohibitive in light of the global demand for transparent conductive electrodes. Additionally, transparent conductive electrodes formed from Indium may be overly brittle and toxic. Therefore, there is a need in the art for a transparent conductive electrode structure and method of forming the structure that is more commercially viable, robust and safe to use.

In view of the foregoing, disclosed herein are embodiments of a structure with a metal silicide transparent conducting electrode, which is commercially viable, robust and safe to use (i.e., non-toxic) and, thus, optimal for incorporation into modern devices, such as flat panel displays, touch panels, solar cells, light emitting diodes (LEDs), organic optoelectronic devices, etc. Specifically, the structure can comprise a substrate (e.g., a glass or plastic substrate) and a transparent conducting film (i.e., a transparent conducting electrode) on that substrate. The transparent conducting film can be made up of a metal silicide nanowire network. For example, in one embodiment, the metal silicide nanowire network can comprise multiple metal silicide nanowires fused together in a disorderly arrangement on the substrate. In another embodiment, the metal silicide nanowire network can comprise multiple metal silicide nanowires fused together in a patterned grid on the substrate. Also disclosed herein are various different method embodiments for forming such a structure.

More particularly, referring to FIGS. 1A-B and 2A-B, disclosed herein are embodiments 100, 200, respectively, of a structure with a metal silicide transparent conducting electrode. Specifically, each of the embodiments 100, 200 of the structure can comprise a substrate 110, 210 (e.g., a transparent glass or plastic substrate) and a transparent conducting film (i.e., a transparent conducting electrode) 120, 220 on that substrate 110, 210.

The transparent conducting film 120, 220 can be made up of a metal silicide nanowire network 150, 250 (i.e., a network of metal silicide nanowires 130, 230). For purposes of this disclosure, a nanowire is a wire, fiber, high aspect ratio line, etc. with a diameter of the order of a nanometer (nm) and, particularly, with a diameter that is tens of nanometers or less. The conductivity of this transparent conducting film 120, 220 can be relatively high, which means that the sheet resistivity can be relatively low (e.g., 100-500 Ohms/square or less). The transparency of this transparent conducting film 120, 220 can also be relatively high (e.g., 60-99% using the AM 1.5 solar spectrum, as a reference). Those skilled in the art will recognize that increasing the nanowire density (i.e., the average amount of nanowire material within a unit area) within the network 150, 250 of metal silicide nanowires 130, 230 results in a corresponding decrease in transparency and increase in conductivity.

The metal silicide nanowire network 150, 250 can have various different configurations, as shown in the different embodiments 100, 200.

Figure 1B:
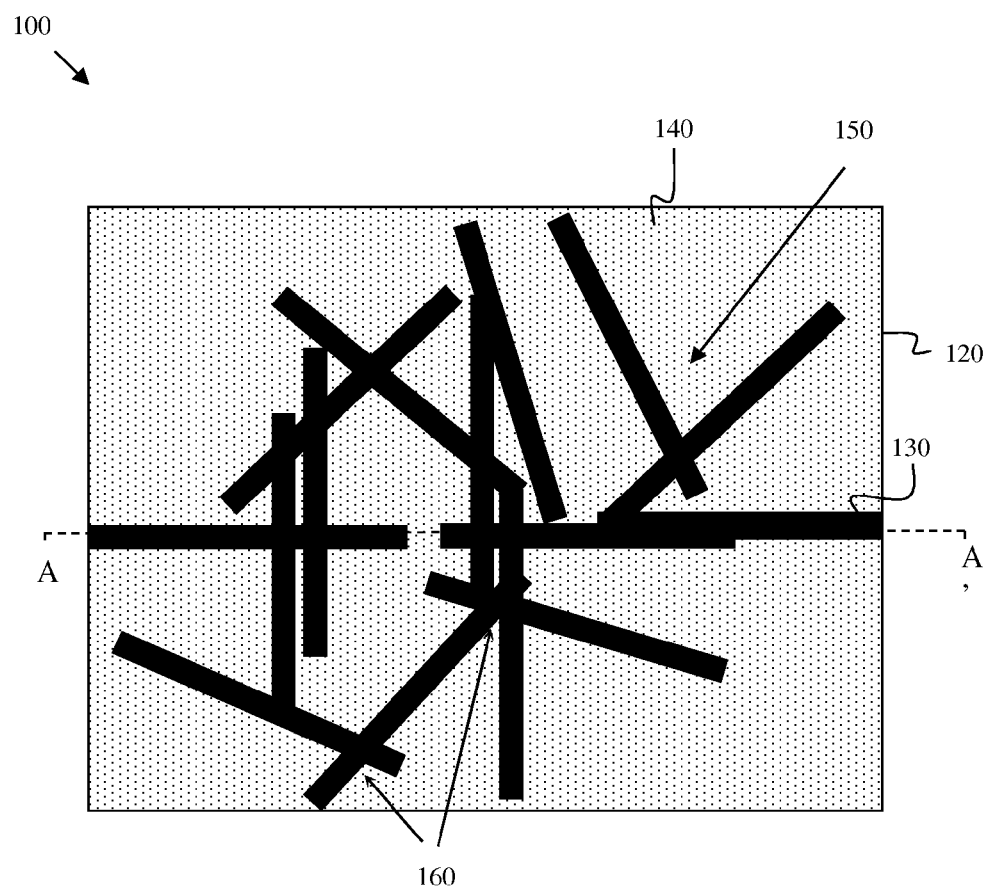
FIG. 1B is a top view diagram of the structure of FIG. 1A.

For example, FIGS. 1A and 1B show cross-section and top view diagrams, respectively, of one embodiment 100 of the structure. In this embodiment 100, the metal silicide nanowire network 150 can comprise multiple metal silicide nanowires 130 in a disorderly arrangement (i.e., a jumble) on the substrate 110 so that they essentially form a metal silicide nanowire mesh across the substrate 110. Additionally, as a result of the silicidation process used to form these metal silicide nanowires 130 (discussed in greater detail below with regard to the method embodiments), they can be fused together at the interfaces 160 between intersecting nanowires (i.e., at the junctions between nanowires that cross and contact each other), thereby reducing resistance across the network 150. The diameter of these metal silicide nanowires 130 can be relatively small (e.g., can range, for example, between 2 nanometers (nm) and 200 nanometers (nm)), the aspect ratio (i.e., diameter to length ratio) of the metal silicide nanowires 130 can be relatively high (e.g., can range between 1:100 and 1:1000 or greater) and the density of the nanowires can be optimized in order to allow for the greatest amount of transparency (e.g., 60-99% using the AM 1.5 solar spectrum, as a reference) and still achieve a desired conductivity.

Figure 2A:
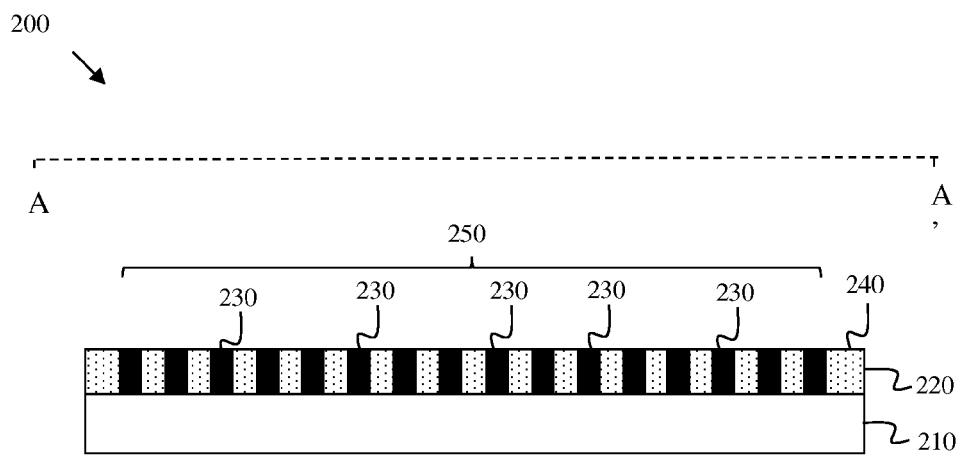
FIG. 2A is a cross-section diagram illustrating another embodiment of a structure with a metal silicide transparent conducting electrode.
Figure 2B:
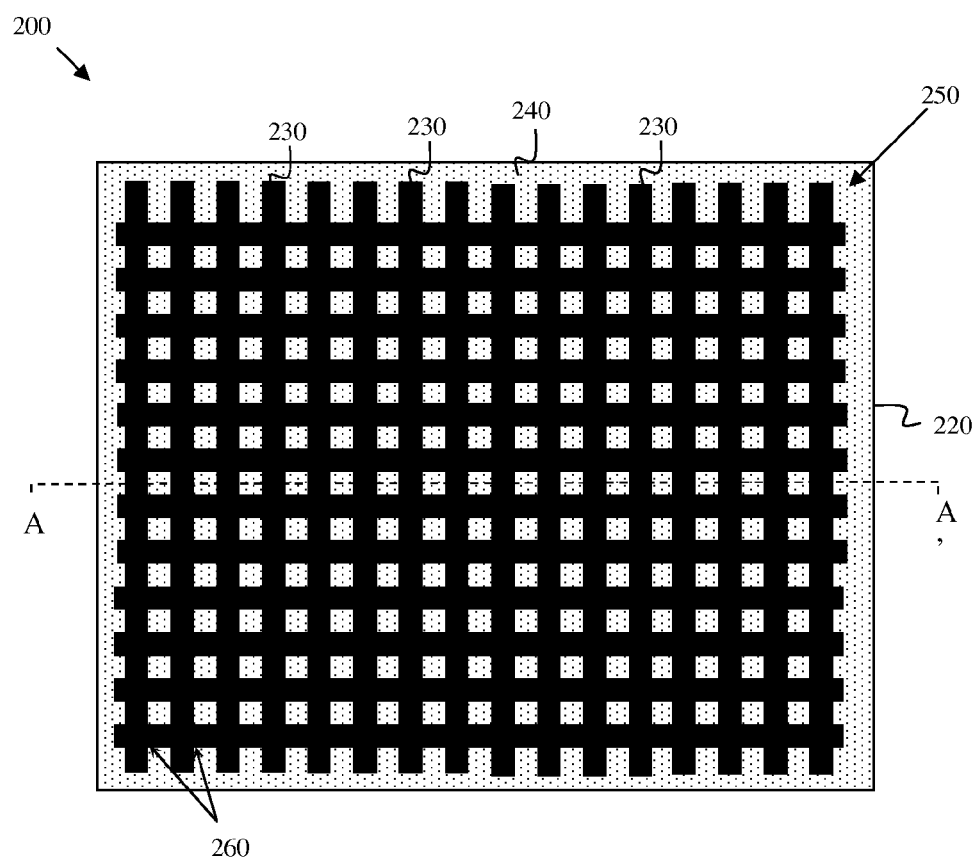
FIG. 2B is a top view diagram of the structure of FIG. 2A.

FIGS. 2A and 2B show cross-section and top view diagrams, respectively, of another embodiment 200 of the structure. In this embodiment 200, the metal silicide nanowire network 250 can comprise multiple metal silicide nanowires 230 patterned in a grid across the substrate 210. This grid can, for example, comprise a first set of parallel metal silicide nanowires arrange in a first direction on the substrate 210 and a second set of a parallel metal silicide nanowires stacked on the first set and arranged in a second direction that is essentially perpendicular to the first set. Additionally, as a result of the silicidation process used to form these metal silicide nanowires 230 (discussed in greater detail below with regard to the method embodiments), they can be fused together at the interfaces 260 between intersecting nanowires (i.e., at the junctions between nanowires that cross and contact each other), thereby reducing resistance across the network 250. The diameter of these metal silicide nanowires 230 can range, for example, between 2 nanometers (nm) and 60 nanometers (nm), the spacing between (i.e., the separation distance between) adjacent parallel metal silicide nanowires 230 can be approximately the same (i.e., uniform) and can range, for example, between 2 nanometers (nm) and 200 nanometers (nm) and the nanowire density can be optimized to allow for the greatest amount of transparency (e.g., 60-99% using the AM 1.5 solar spectrum, as a reference) and still achieve a desired conductivity (e.g. sheet resistivity of 100-500 Ohms/square or less).

In each of these embodiments 100, 200, the metal silicide nanowires 130, 230 can comprise a single type of metal silicide nanowire. That is, all of the metal silicide nanowires 130, 230 on the substrate 110, 210 can be made from the same silicided metal or metal alloy. Preferably, the metal can comprise a refractory metal or refractory metal alloy. Thus, for example, each of the metal silicide nanowires 130, 230 in the metal silicide nanowire network 150, 250 can comprise a nickel (Ni) silicide nanowire, a cobalt (Co) silicide nanowire, a tungsten (W) silicide nanowire, a chromium (Cr) silicide nanowire, a platinum (Pt) silicide nanowires, a titanium (Ti) silicide nanowire, a molybdenum (Mo) silicide nanowire, a palladium (Pd) silicide nanowire or a refractory metal alloy silicide nanowire.

Alternatively, in each these embodiments 100, 200 the metal silicide nanowires 130, 230 in the metal silicide nanowire network 150, 250 can comprise multiple different types of metal silicide nanowires. That is, some of the metal silicide nanowires 130, 230 on the substrate 110, 210 can be made from a different silicided metal or metal alloy than others. Thus, for example, the metal silicide nanowires 130, 230 in the metal silicide nanowire network 150, 250 can comprise a mix of nickel (Ni) silicide nanowires, cobalt (Co) silicide nanowires, tungsten (W) silicide nanowires, chromium (Cr) silicide nanowires, platinum (Pt) silicide nanowire, titanium (Ti) silicide nanowires, molybdenum (Mo) silicide nanowires, palladium (Pd) silicide nanowires and/or nanowires comprising any refractory metal silicide. It should be noted that, as discussed in greater detail below with regard to the method embodiments, the incorporation of a mix of different types of nanowires into the metal silicide nanowire network is more easily achieved in the embodiment 100 as the process steps used to form this structure require suspension of nanowires in a solution prior to deposition onto the substrate.

In addition to the metal silicide nanowire network 150, 250, in each of the embodiments 100, 200, the transparent conducting film 120, 220 can further comprise a transparent polymer layer 140, 240. This transparent polymer layer 140, 240 can coat the metal silicide nanowire network 150, 250 and, more particularly, can fill in any gaps (i.e., spaces) between the metal silicide nanowires 130, 230 within the metal silicide nanowire network 150, 250 in order to provide protection and support. Optionally, the transparent polymer layer 140, 240 can be electrically conductive, thereby further increasing the conductivity of the transparent conducting film 120, 220. For example, the transparent polymer layer 140, 240 can comprise a transparent non-conductive polymer layer containing conductive particles (e.g., metal particles) or a transparent conductive polymer layer (e.g., a poly(3,4-ethylenedioxythiophene) PEDOT:poly(styrene sulfonate) PSS compound layer).

Figure 3:
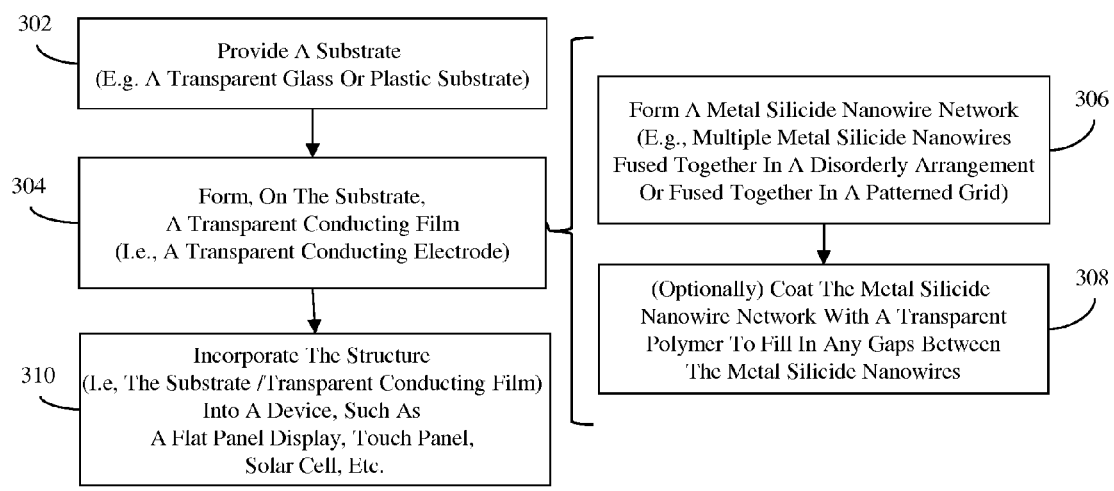
FIG. 3 is a flow diagram of a method of forming a structure as in FIGS. 1A-B or FIGS. 2A-B.

Referring to the flow diagram of FIG. 3, also disclosed herein are method embodiments for forming such a structure. The method embodiments can comprise providing a substrate (e.g., a transparent glass or plastic substrate) (302) and forming a transparent conducting film (i.e., a transparent conducting electrode) on that substrate (304).

Specifically, in order to form the transparent conducting film, a metal silicide nanowire network can be formed on the substrate (306).

In one embodiment, as illustrated in FIGS. 1A-1B and discussed in greater detail below, a metal silicide nanowire network 150 can be formed at process 306 such that it comprises multiple metal silicide nanowires 130 fused together in a disorderly arrangement (i.e., a jumble) on the substrate 110 so that they essentially form a metal silicide nanowire mesh across the substrate 110. Such a metal silicide nanowire network 150 can be achieved using various different processing techniques (see the flow diagrams of FIGS. 4A-4D).

Figure 4A:
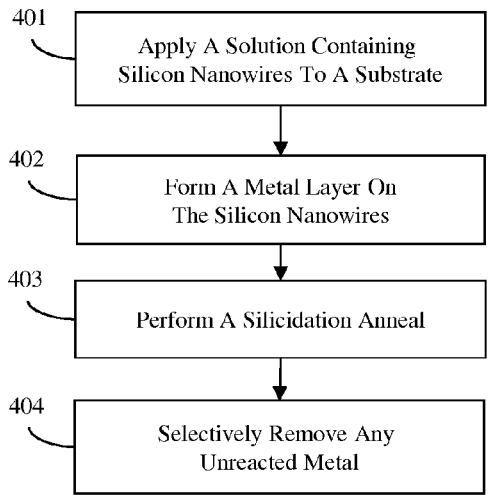
FIG. 4A is a flow diagram illustrating a technique for performing process 306 of FIG. 3 to form the structure of FIGS. 1A-B.
Figure 5A:
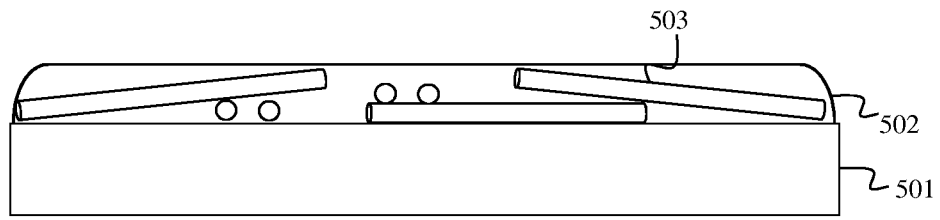
FIG. 5A is cross-section diagram illustrating a partially completed structure formed according to the technique of FIG. 4A.
Figure 5B:
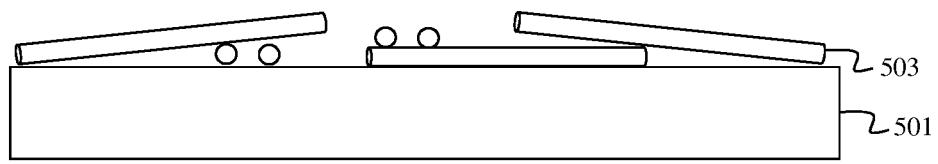
FIG. 5B is cross-section diagram illustrating a partially completed structure formed according to the technique of FIG. 4A.
Figure 5C:
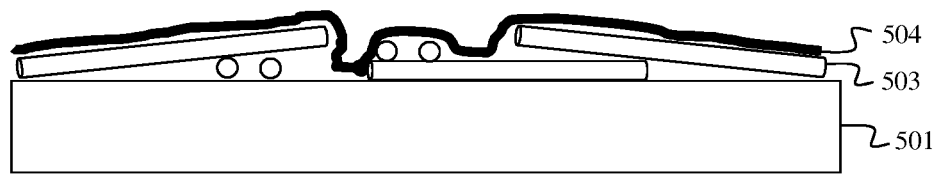
FIG. 5C is cross-section diagram illustrating a partially completed structure formed according to the technique of FIG. 4A.

For example, referring to the flow diagram of FIG. 4A, in order to form the metal silicide nanowire network 150 of FIGS. 1A-1B a solution 502 (i.e., a dispersion), which contains a plurality of silicon nanowires 503 suspended in a solvent, can be applied to a substrate 501 (401, see FIG. 5A). The solvent can subsequently be evaporated away such that only the silicon nanowires 503 remain on the surface of the substrate 501 (see FIG. 5B). Next, a metal layer 504 can be formed (e.g., uniformly or selectively deposited by physical vapor deposition (PVD), deposited by chemical vapor deposition (CVD), etc.) over the silicon nanowires 503 (402, see FIG. 5C). Finally, a silicidation anneal can be performed and any unreacted metal can be selectively removed (e.g., using a wet etch process) (403-404).

Figure 4B:
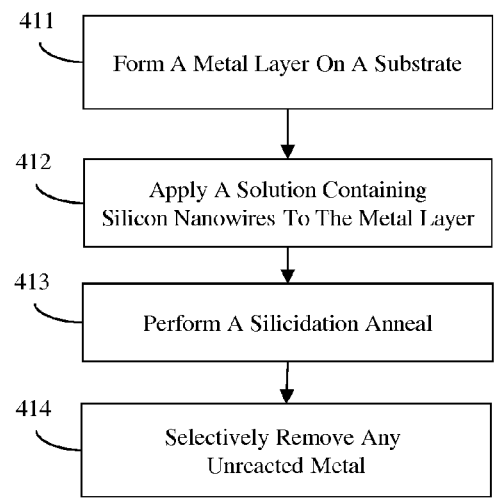
FIG. 4B is a flow diagram illustrating another technique for performing process 306 of FIG. 3 to form the structure of FIGS. 1A-1B.
Figure 6A:
FIG. 6A is cross-section diagram illustrating a partially completed structure formed according to the technique of FIG. 4B.
Figure 6B:
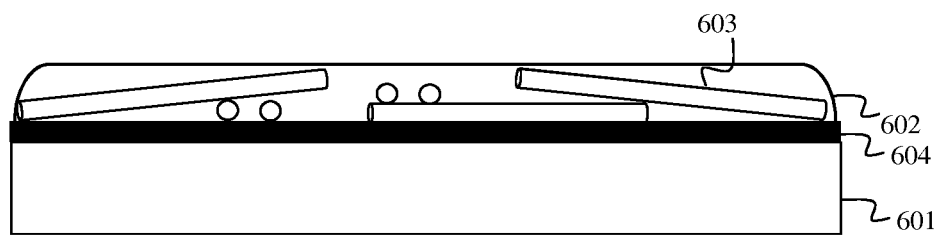
FIG. 6B is cross-section diagram illustrating a partially completed structure formed according to the technique of FIG. 4B.
Figure 6C:
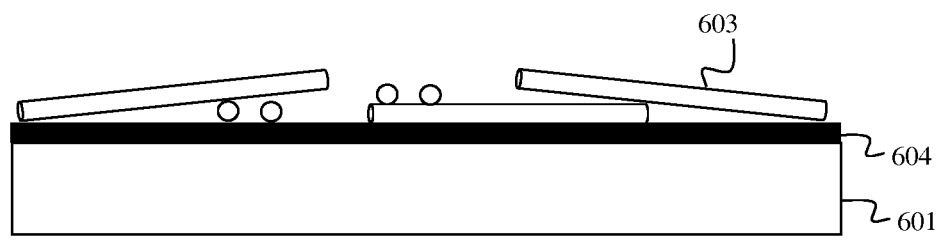
FIG. 6C is cross-section diagram illustrating a partially completed structure formed according to the technique of FIG. 4B.

Alternatively, referring to the flow diagram of FIG. 4B, in order to form the metal silicide nanowire network 150 of FIGS. 1A-1B a metal layer 604 can be formed (e.g., deposited by electrodeposition, physical vapor deposition (PVD) or chemical vapor deposition) on a substrate 601 (411, see FIG. 6A). Then, a solution 602 (i.e., a dispersion), which contains a plurality of silicon nanowires 603 suspended in a solvent, can be applied to the metal layer 604 (412, see FIG. 6B). The solvent can subsequently be evaporated away such that only the silicon nanowires 603 remain on the surface of the metal layer 604 (see FIG. 6C). Finally, a silicidation anneal can be performed and any unreacted metal can be selectively removed (e.g., by a wet etch process) (413-414).

With regard to the process steps set forth in the flow diagrams of FIGS. 4A and 4B and illustrated in FIGS. 5A-C and 6A-C, respectively, it should be noted that techniques for fabricating silicide nanowires (e.g., by growth on catalyst particles) are well-known in the art and, thus, are omitted from this specification in order to allow the reader to focus on the salient aspects of the invention. In any case, the silicon nanowires 503, 603 can, for example, be formed so as to have a diameter ranging between 2 nanometers (nm) and 200 nanometers (nm) and an aspect ratio (i.e., diameter to length ratio) ranging between 1:100 and 1:1000 or greater. The solution can comprise 0.01%-5% by weight of silicon nanowires 503, 603 in order to avoid agglomeration in the solution and achieve a desired nanowire density following solvent evaporation and, thereby to achieve a desired transparency (e.g., 60-99% using the AM 1.5 solar spectrum, as a reference) and a desired conductivity (e.g., sheet resistivity of 100-500 Ohms/square or less) in the resulting metal silicide nanowire network. It should further be noted that the solvent portion of the solution 502, 602 should be a solvent suitable for use in dispersion. Specifically, the solvent can comprise any suitable fluid or mixture of fluids that is capable of forming a solution with the silicon nanowires 503, 603 and that can be volatilized at a desired, relatively low temperature (e.g., a boiling point of less than 250° C.). An exemplary solution suitable for suspending silicon nanowires 503, 603 can contain one part ethanol and two parts chloroform. Such a solution 502, 602 can be applied, for example, by spray coating, roll coating, spin coating, etc.

Finally, the metal layer 504, 604 can comprise a refractory metal or refractory metal alloy layer. Thus, for example, the metal layer 504, 604 can comprise a layer of nickel (Ni), cobalt (Co), tungsten (W), chromium (Cr), platinum (Pt), titanium (Ti), molybdenum (Mo), palladium (Pd) or an alloy of any of these metals.

The above-described techniques can, for example, be used to form a nickel silicide (NiSi) nanowire network with a resistivity 14-20 µohm-cm from a nickel layer and silicon nanowires. Specifically, a nickel silicide (NiSi) nanowire network can be formed using a sintering temperature (i.e., a silicidation anneal temperature) of 400° C.-600° C. and is stable on silicon up to 650° C. In this case, 1.83 nm of silicon will be consumed per nm of nickel. The resulting silicide thickness per nm of metal will be roughly 2.34 nm. Those skilled in the art will recognize that these conditions will vary depending upon the metal material used. However, it should be understood that the consumption of the silicon nanowires 503, 603 should be maximized during the silicidation anneal such that a minimal etch is required to remove any unreacted material. The technique should also attempt to maximize conductivity.

Figure 4C:
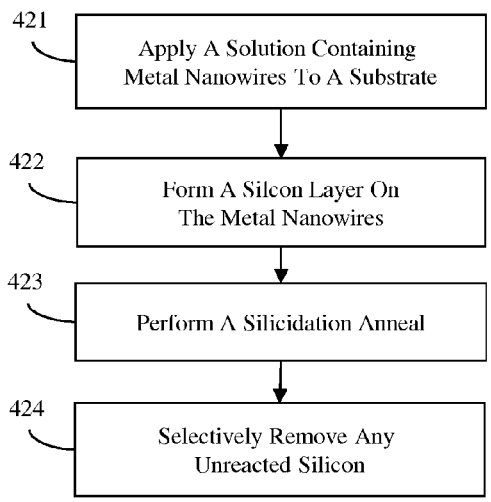
FIG. 4C is a flow diagram illustrating yet another technique for performing process 306 of FIG. 3 to form the structure of FIGS. 1A-1B.
Figure 7A:
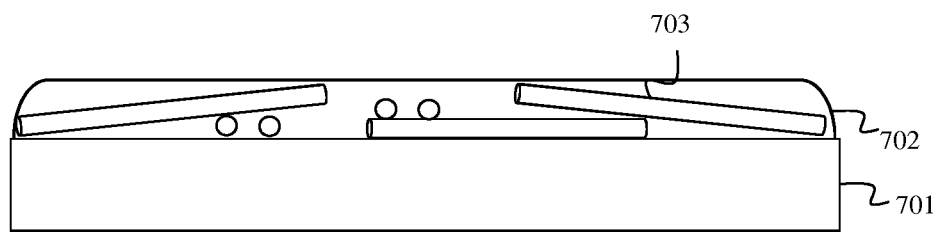
FIG. 7A is cross-section diagram illustrating a partially completed structure formed according to the technique of FIG. 4C.
Figure 7B:
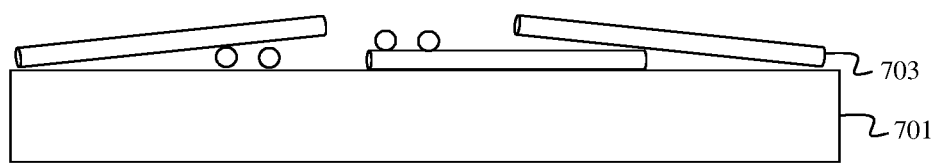
FIG. 7B is cross-section diagram illustrating a partially completed structure formed according to the technique of FIG. 4C.
Figure 7C:
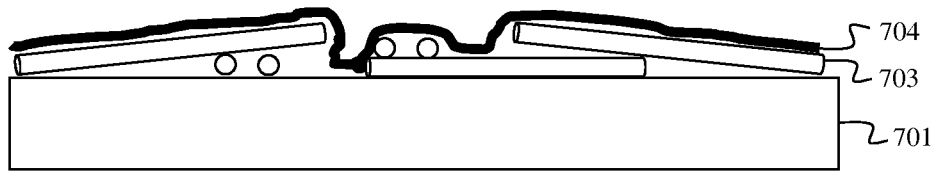
FIG. 7C is cross-section diagram illustrating a partially completed structure formed according to the technique of FIG. 4C.

Alternatively, referring to the flow diagram of FIG. 4C, in order to form the metal silicide nanowire network 150 of FIGS. 1A-1B a solution 702 (i.e., a dispersion), which contains a plurality of metal nanowires 703 suspended in a solvent, can be applied to a substrate 701 (421, see FIG. 7A). The solvent can subsequently be evaporated away such that only the metal nanowires 703 remain on the surface of the substrate 701 (see FIG. 7B). Next, a silicon layer 704 can be formed (e.g., deposited) over the metal nanowires 703 (422, see FIG. 7C). Finally, a silicidation anneal can be performed and any unreacted silicon can be selectively removed (e.g., by a dry etch process), thereby forming a metal silicide nanowire network 150 (423-424, see FIGS. 1A-1B and the detailed description above).

Figure 4D:
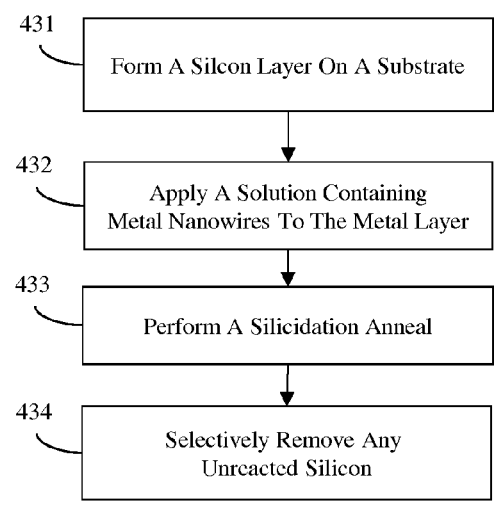
FIG. 4D is a flow diagram illustrating yet another technique for performing process 306 of FIG. 3 to form the structure of FIGS. 1A-1B.
Figure 8A:
FIG. 8A is cross-section diagram illustrating a partially completed structure formed according to the technique of FIG. 4D.
Figure 8B:
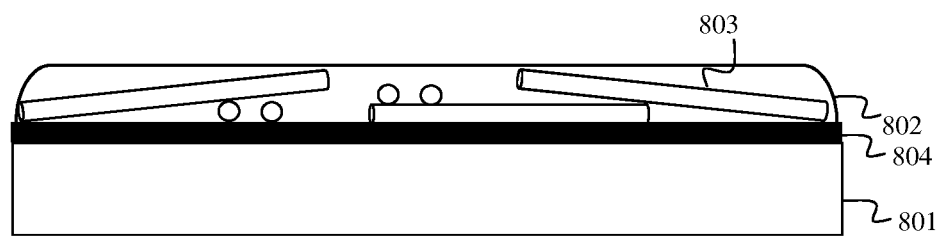
FIG. 8B is cross-section diagram illustrating a partially completed structure formed according to the technique of FIG. 4D.
Figure 8C:
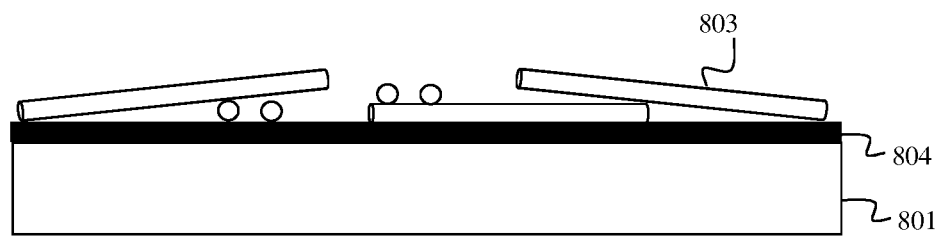
FIG. 8C is cross-section diagram illustrating a partially completed structure formed according to the technique of FIG. 4D.

Alternatively, referring to the flow diagram of FIG. 4D, in order to form the metal silicide nanowire network 150 of FIGS. 1A-1B a silicon layer 804 can be formed (e.g., deposited) on a substrate 801 (431, see FIG. 8A). Then, a solution 802 (i.e., a dispersion), which contains a plurality of metal nanowires 803 suspended in a solvent, can be applied to the silicon layer 804 (412, see FIG. 8B). The solvent can subsequently be evaporated away such that only the metal nanowires 803 remain on the surface of the silicon layer 804 (see FIG. 8C). Finally, a silicidation anneal can be performed and any unreacted silicon can be selectively removed (e.g., by a dry etch process) (433-434).

With regard to the process steps set forth in the flow diagrams of FIGS. 4C and 4D and illustrated in FIGS. 7A-C and 8A-C, respectively, it should be noted that techniques for fabricating metal nanowires (e.g., by electrodeposition into template nanopores) are well-known in the art and, thus, are omitted from this specification in order to allow the reader to focus on the salient aspects of the invention. In any case, the metal nanowires 703, 803 can, for example, be formed so as to have a diameter ranging between 2 nanometers (nm) and 200 nanometers (nm) and an aspect ratio (i.e., diameter to length ratio) ranging between 1:100 and 1:1000 or greater. Furthermore, the metal nanowires 703, 803 can comprise a refractory metal or refractory metal alloy. Thus, for example, the metal nanowires 703, 803 can comprise nanowires of nickel (Ni), cobalt (Co), tungsten (W), chromium (Cr), platinum (Pt), titanium (Ti), molybdenum (Mo), palladium (Pd) or an alloy of any of these metals. Furthermore, because the metal nanowires are suspended in a solution for deposition, a single type of metal nanowire can be used (i.e., all the nanowires can be made of the same type of metal or metal alloy) or different types of metal nanowires can be used (i.e., some of the metal nanowires can be made of one type of metal or metal alloy and other can be made of a different type of metal or metal alloy).

The solution can comprise 0.01%-5% by weight of metal nanowires 703, 803 in order to avoid agglomeration in the solution and achieve a desired nanowire density following solvent evaporation and, thereby to achieve a desired transparency (e.g., 60-99% using the AM 1.5 solar spectrum, as a reference) and a desired conductivity (e.g., sheet resistivity of 100-500 Ohms/square or less) in the resulting metal silicide nanowire network. It should further be noted that the solvent portion of the solution 702, 802 should be a solvent suitable for use in dispersion. Specifically, the solvent can comprise any suitable fluid or mixture of fluids that is capable of forming a solution with the metal nanowires 703, 803 and that can be volatilized at a desired, relatively low temperature (e.g., a boiling point of less than 250° C.). An exemplary solution suitable for suspending nickel nanowires can contain isopropanol. Those skilled in the art will, however, recognize that the optimal suspension solution will vary depending upon the type of metal nanowires used. In any case, this solution 702, 802 can be applied, for example, by spray coating, roll coating, spin coating, etc.

Additionally, with regard to the process steps set forth in each of the flow diagrams of FIGS. 4A, 4B, 4C, and 4D, it should further be noted that the silicidation anneal 403, 413, 423, 433 is a thermal anneal performed in order to cause metal atoms from the metal layer or metal nanowires, as applicable, to react with the silicon material from the silicon layer or silicon nanowires, as applicable. Those skilled in the art will recognize that the specifications for the silicidation anneal (e.g., the anneal temperature and duration) will vary depending upon materials used, their thicknesses, etc. Thus, the thickness of the silicon layer 704, 804 should be chosen in relation to the thickness of the metal nanowires 703, 803 with the objective being to maximize the conductivity of the resulting metal silicide nanowire network and maximize the consumption/reaction of silicon during the silicidation process. In this case, the thickness of the silicon consumed can range from 0.5 nm to 4 nm per nm of metal depending on the metal chosen. Furthermore, sintering temperatures (i.e., silicidation anneal temperatures) as low as 250° C. and as high as 1000° C. can be used. As a result, a metal silicide nanowire network 150 is created with multiple metal silicide nanowires 130 fused together at the interfaces 160 between intersecting nanowires (i.e., at the junctions between nanowires that cross and contact each other), thereby reducing resistance across the network 150 (see FIGS. 1A-1B and the detailed description above).

Finally, it should be noted that in one embodiment the substrate 501, 601, 701, 801, as shown in FIGS. 5A-C, 6A-C, 7A-C, and 8A-C, respectively, on which the metal silicide nanowire network is initially formed can be the same substrate (e.g., a transparent glass or plastic substrate) as shown in the final structure of FIGS. 1A-1B. However, alternatively, this substrate 501, 601, 701, and 801 can comprise a dummy substrate (i.e., a sacrificial substrate). The dummy substrate can comprise a dielectric substrate (e.g., a silicon dioxide (SiO2) substrate) or other suitable substrate onto which the metal silicide nanowire network can be formed and subsequently removed. In this case, at some point during processing (e.g., after the silicidation anneal, but prior to the selective removal of any unreacted metal or silicon) the metal silicide nanowire network can be transferred from the dummy substrate to the final substrate (i.e., to the transparent glass or plastic substrate). Those skilled in the art will recognize that this transfer can be performed, for example, using thermal tape to lift the metal silicide nanowire network off the dummy substrate and place it on the final substrate.

In another embodiment, as illustrated in FIGS. 2A-2B and discussed in greater detail below, a metal silicide nanowire network 250 can be formed at process 306 such that it comprises multiple metal silicide nanowires 230 fused together in a patterned grid on the substrate 210. Such a metal silicide nanowire network 250 can be achieved using various different processing techniques (see the flow diagrams of FIGS. 9A-9D).

Figure 9A:
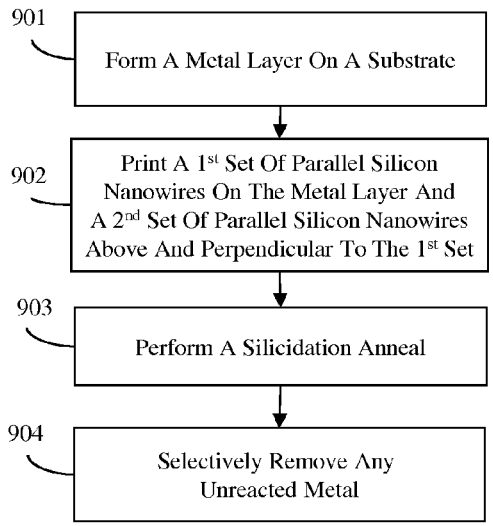
FIG. 9A is a flow diagram illustrating a technique for performing process 306 of FIG. 3 to form the structure of FIGS. 2A-B.
Figure 10A:
FIG. 10A is cross-section diagram illustrating a partially completed structure formed according to the technique of FIG. 9A.
Figure 10B:
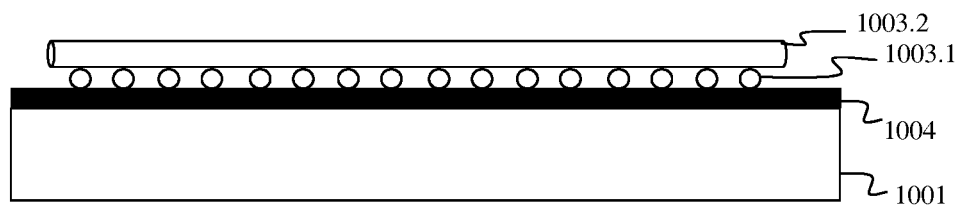
FIG. 10B is cross-section diagram illustrating a partially completed structure formed according to the technique of FIG. 9A.
Figure 10C:
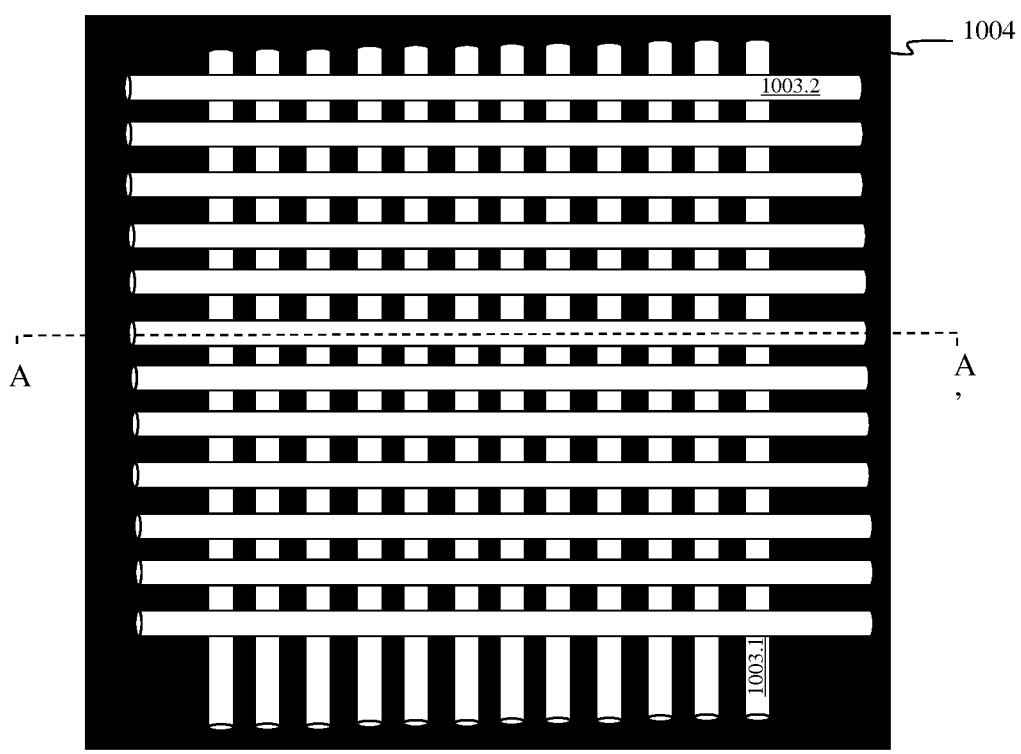
FIG. 10C is top diagram illustrating the same partially completed structure as shown in FIG. 10B.

For example, referring to the flow diagram of FIG. 9A, in order to form the metal silicide nanowire network 250 of FIGS. 2A-2B a metal layer 1004 can be formed (e.g., uniformly or selectively deposited by electrodepostion, physical vapor deposition (PVD) or chemical vapor deposition) on the substrate 1001 (901, see FIG. 10A). Then, a first set of multiple parallel silicon nanowires 1003.1 can be printed on the metal layer 1004 and a second set of multiple parallel silicon nanowires 1003.2 can be printed on the metal layer 1004 over the first set of multiple parallel silicon nanowires 1003.1 such that the first set is perpendicular to the second set (902, see FIGS. 10B and 10C). Finally, a silicidation anneal can be performed and any unreacted metal can be selectively removed (e.g., using a wet etch process)(903-904).

Figure 9B:
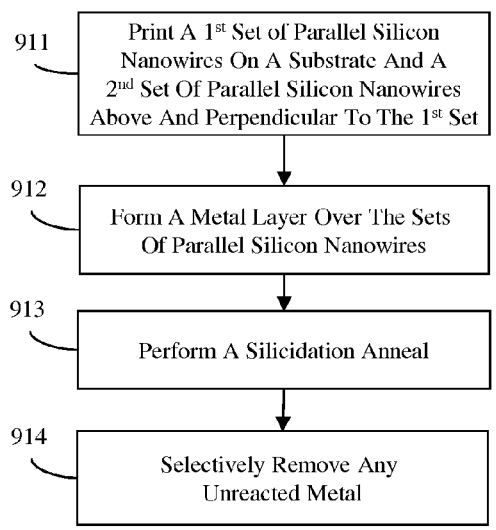
FIG. 9B is a flow diagram illustrating another technique for performing process 306 of FIG. 3 to form the structure of FIGS. 2A-1B.
Figure 11A:
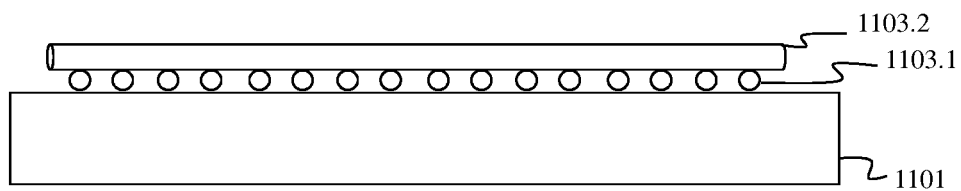
FIG. 11A is cross-section diagram illustrating a partially completed structure formed according to the technique of FIG. 9B.
Figure 11B:
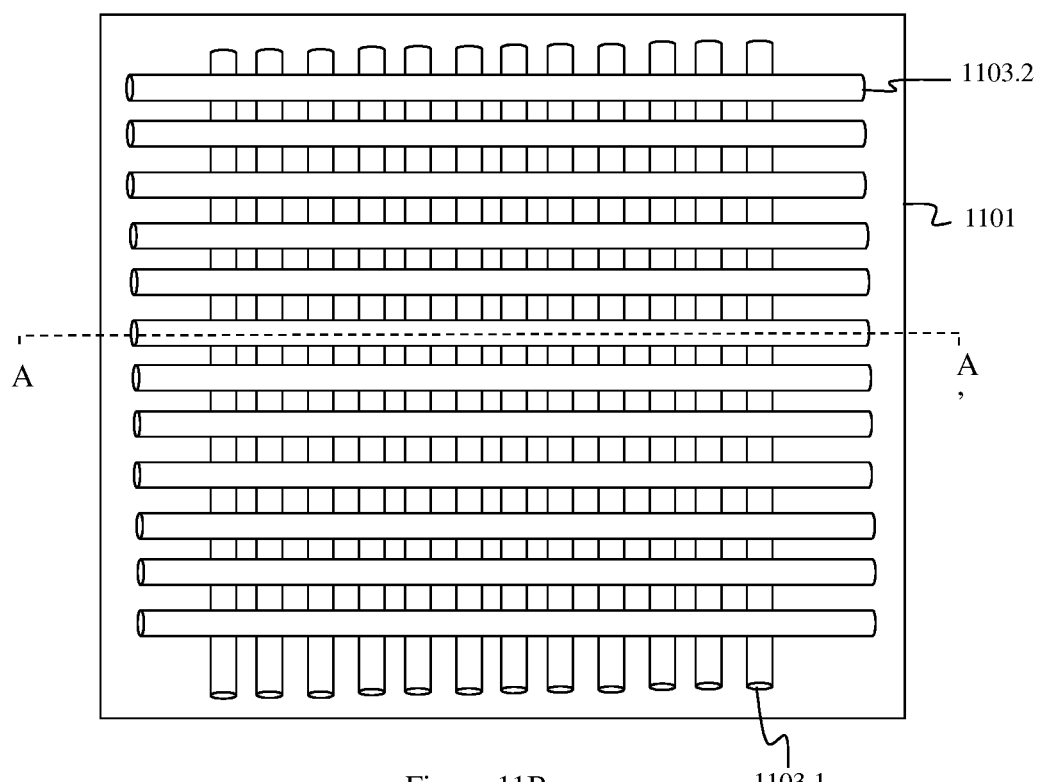
FIG. 11B is top view diagram illustrating the same partially completed structure as shown in FIG. 11A.
Figure 11C:
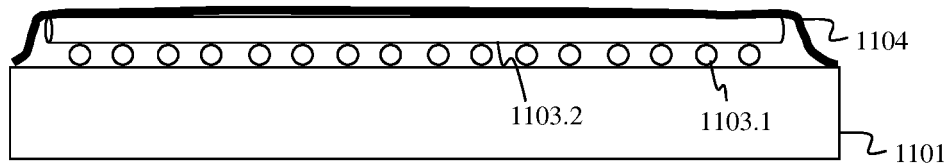
FIG. 11C is cross-section diagram illustrating a partially completed structure formed according to the technique of FIG. 9B.

Alternatively, referring to the flow diagram of FIG. 9B, in order to form the metal silicide nanowire network 250 of FIGS. 2A-2B, a first set of multiple parallel silicon nanowires 1103.1 can be printed on a substrate 1101 and a second set of multiple parallel silicon nanowires 1103.2 can be printed on the substrate 1101 over the first set of multiple parallel silicon nanowires 1103.1 such that the first set is perpendicular to the second set (911, see FIGS. 11A and 11B). Then, a metal layer 1104 can be formed (e.g., uniformly or selectively deposited by physical vapor deposition (PVD), chemical vapor deposition (CVD), etc.) over the first set and the second set (902, see FIG. 11C). Finally, a silicidation anneal can be performed and any unreacted metal can be selectively removed (e.g., using a wet etch process) (913-914).

With regard to the process steps set forth in the flow diagrams of FIGS. 9A and 9B and illustrated in FIGS. 10A-C and 11A-C, respectively, it should be noted that the metal layer 1004, 1104 can comprise a refractory metal or refractory metal alloy layer. Thus, for example, the metal layer 1004, 1104 can comprise a layer of nickel (Ni), cobalt (Co), tungsten (W), chromium (Cr), platinum (Pt), titanium (Ti), molybdenum (Mo), palladium (Pd) or an alloy of any of these metals.

Figure 9C:
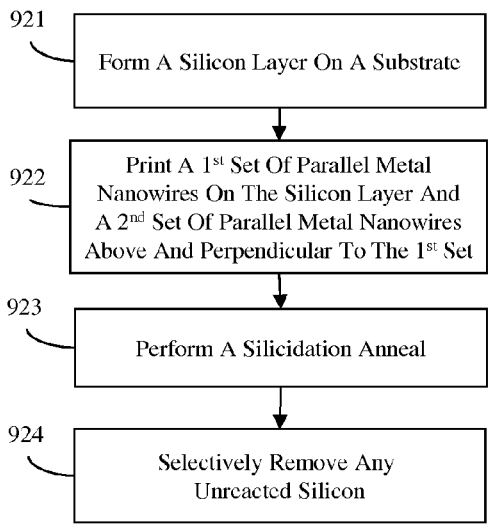
FIG. 9C is a flow diagram illustrating yet another technique for performing process 306 of FIG. 3 to form the structure of FIGS. 2A-1B.
Figure 12A:
FIG. 12A is cross-section diagram illustrating a partially completed structure formed according to the technique of FIG. 9C.
Figure 12B:
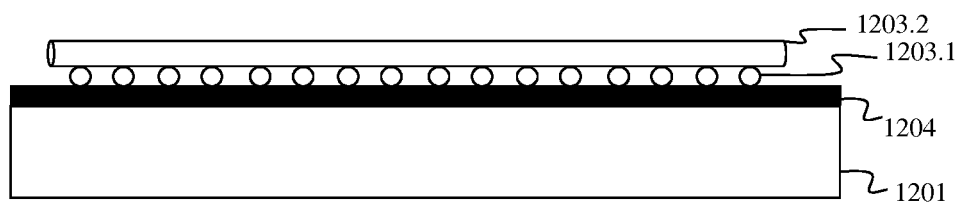
FIG. 12B is cross-section diagram illustrating a partially completed structure formed according to the technique of FIG. 9C.
Figure 12C:
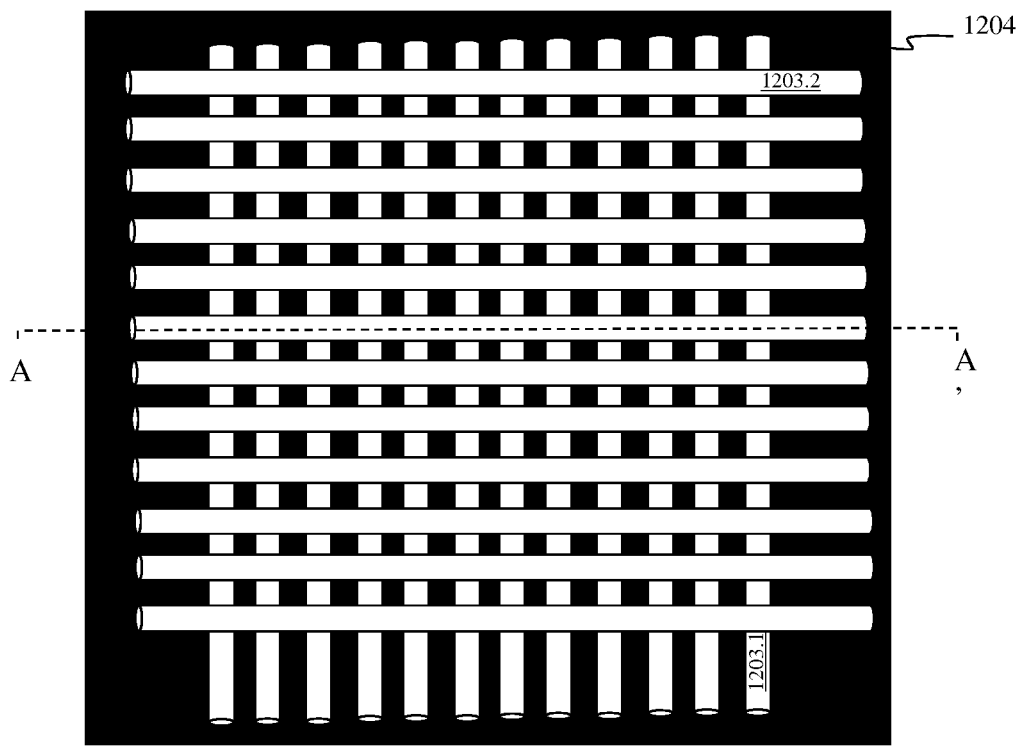
FIG. 12C is top view diagram illustrating the same partially completed structure as shown in FIG. 12B.

Alternatively, referring to the flow diagram of FIG. 9C, in order to form the metal silicide nanowire network 250 of FIGS. 2A-2B a silicon layer 1204 can be formed (e.g., deposited) on a substrate 1201 (921, see FIG. 12A). Then, a first set of multiple parallel metal nanowires 1203.1 can be printed on the silicon layer 1204 and a second set of multiple parallel metal nanowires 1203.2 can be printed on the silicon layer 1204 over the first set of multiple parallel metal nanowires 1203.1 such that the first set is perpendicular to the second set (922, see FIGS. 12B and 12C). Finally, a silicidation anneal can be performed and any unreacted silicon can be selectively removed (e.g., using a dry etch process) (923-924).

Figure 9D:
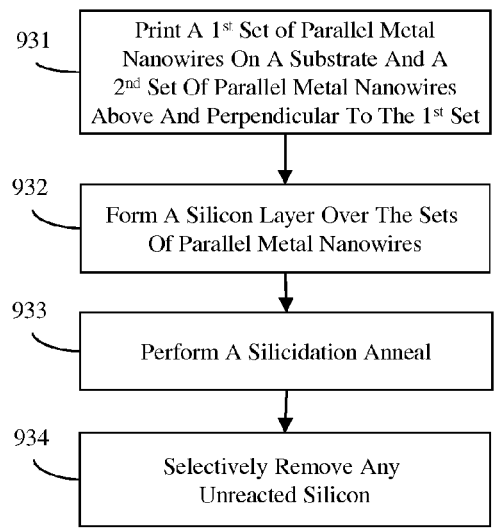
FIG. 9D is a flow diagram illustrating yet another technique for performing process 306 of FIG. 3 to form the structure of FIGS. 2A-1B.
Figure 13A:
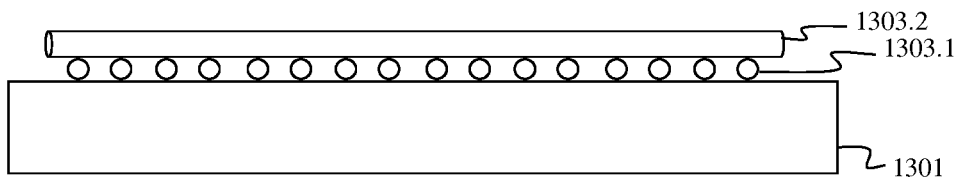
FIG. 13A is cross-section diagram illustrating a partially completed structure formed according to the technique of FIG. 9D.
Figure 13B:
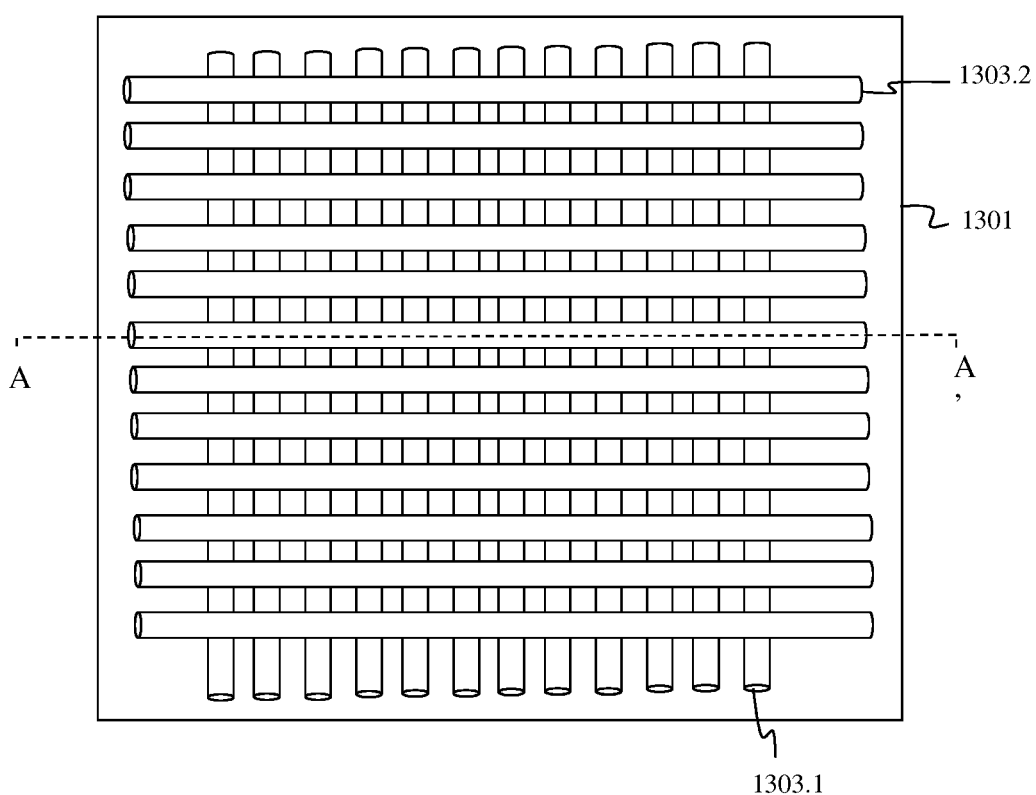
FIG. 13B is a top view diagram illustrating the same partially completed structure as shown in FIG. 13A.
Figure 13C:
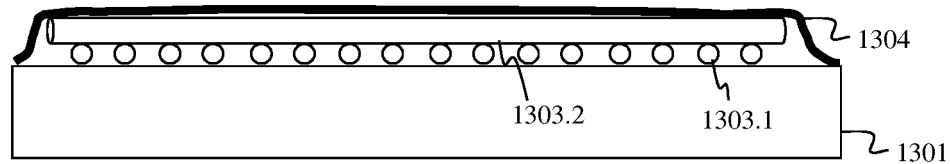
FIG. 13C is cross-section diagram illustrating a partially completed structure formed according to the technique of FIG. 9D.

Alternatively, referring to the flow diagram of FIG. 9D, in order to form the metal silicide nanowire network 250 of FIGS. 2A-2B, a first set of multiple parallel metal nanowires 1303.1 can be printed on a substrate 1301 and a second set of multiple parallel silicon nanowires 1303.2 can be printed on the substrate 1301 over the first set of multiple parallel silicon nanowires 1303.1 such that the first set is perpendicular to the second set (931, see FIGS. 13A and 13B). Then, a silicon layer 1304 can be formed (e.g., deposited) over the first set and the second set (932, see FIG. 13C). Finally, a silicidation anneal can be performed and any unreacted silicon can be selectively removed (e.g., using a dry etch process) (913-914).

With regard to the process steps set forth in the flow diagrams of FIGS. 9C and 9D and illustrated in FIGS. 12A-C and 13A-C, respectively, it should be noted that the metal nanowires 1203.1-1203.2, 1303.1-1303.2 can comprise a refractory metal or refractory metal alloy. Thus, for example, the metal nanowires 1203.1-1203.2, 1303.1-1303.2 can comprise nanowires of nickel (Ni), cobalt (Co), tungsten (W), chromium (Cr), platinum (Pt), titanium (Ti), molybdenum (Mo), palladium (Pd) or an alloy of any of these metals. Furthermore, because the metal nanowires are layered during multiple printing processes, a single type of metal nanowire can be used (i.e., all the nanowires can be made of the same type of metal or metal alloy) or different types of metal nanowires can be used (i.e., the first set of metal nanowires can be made of one type of metal or metal alloy and the second set can be made of a different type of metal or metal alloy).

With regard to the process steps set forth in each of the flow diagrams of FIGS. 9A, 9B, 9C, and 9D, it should be understood that techniques for printing sets of parallel nanowires, including silicon nanowires and metal nanowires, onto a substrate are well known in the art (e.g., by using a superlattice template to form the nanowires, as shown in U.S. Patent Application Publication 2005/02560276 of Heath et al., published on Nov. 10, 2005 and incorporated herein by reference) and, thus, the details of these techniques are omitted from this specification in order to allow the reader to focus on the salient aspects of the invention. However, these techniques should be performed such that the diameter of the metal nanowires range, for example, between 2 nanometers (nm) and 200 nanometers (nm) and that the spacing between (i.e., the separation distance between) adjacent parallel metal nanowires is maximized (e.g., between 2 nanometers (nm) and 200 nanometers (nm)) so that the resulting nanowire density is optimized to allow for the greatest amount of transparency (e.g., 60-99% using the AM 1.5 solar spectrum, as a reference) and still achieve a desired conductivity (e.g. sheet resistivity of 100-500 Ohms/square or less).

It should also be noted that, as discussed with regard to the previous method embodiment, the silicidation anneal is a thermal anneal performed in order to cause metal atoms from the metal layer or metal nanowires, as applicable, to react with the silicon material from the silicon layer or silicon nanowires, as applicable. Those skilled in the art will recognize that the specifications for the silicidation anneal (e.g., the anneal temperature and duration) will vary depending upon materials used, their thicknesses, etc. As a result, a metal silicide nanowire network 250 is created with multiple metal silicide nanowires 230 fused together at the interfaces 260 between intersecting nanowires (i.e., at the junctions between nanowires that cross and contact each other), thereby reducing resistance across the network 250 (see FIGS. 2A-2B and the detailed description above).

Finally, it should be noted that in one embodiment, the substrate 1001, 1101, 1201, 1301, as shown in FIGS. 10A-C, 11A-C, 12A-C, and 13A-C, respectively, on which the metal silicide nanowire network is initially formed can be the same substrate (e.g., a transparent glass or plastic substrate) as shown in the final structure of FIGS. 2A-2B. However, alternatively, this substrate 1001, 1101, 1201, and 1301 can comprise a dummy substrate (i.e., a sacrificial substrate). The dummy substrate can comprise a dielectric substrate (e.g., a silicon dioxide ($SiO_2$) substrate) or other suitable substrate onto which the metal silicide nanowire network can be formed and subsequently removed. In this case, at some point during processing (e.g., after the silicidation anneal, but prior to the selective removal of any unreacted metal or silicon) the metal silicide nanowire network can be transferred from the dummy substrate to the final substrate (i.e., to the transparent glass or plastic substrate). Those skilled in the art will recognize that this transfer can be performed, for example, using thermal tape to lift the metal silicide nanowire network off the dummy substrate and place it on the final substrate.

Referring again to the flow diagram of FIG. 3 and to the embodiments 100, 200 of the structure as shown in FIGS. 1A-B and 2A-B, optionally, after the metal silicide nanowire network 150, 250 is formed on the substrate 110, 210, a transparent polymer layer 140, 240 can be formed in order to provide protection and support to the network 150, 250 (308). Specifically, this transparent polymer layer 140, 240 can be formed (e.g., deposited) so as to coat the metal silicide nanowire network 150, 250 and, more particularly, so as to fill in any gaps (i.e., spaces) between the metal silicide nanowires 130, 230 of the metal silicide nanowire network 150, 250. Optionally, this transparent polymer layer 140, 240 can be electrically conductive, thereby further increasing the conductivity of the transparent conducting film 120, 220. For example, the transparent polymer layer 140, 240 can comprise a transparent non-conductive polymer layer containing conductive particles (e.g., metal particles) or a transparent conductive polymer layer (e.g., a poly(3,4-ethylenedioxythiophene) PEDOT:poly(styrene sulfonate) PSS compound layer).

The resulting transparent conducting film 120, 220 (i.e., the metal silicide transparent conducting film) is safer and more commercially viable than prior art transparent conducting films because it incorporates materials that are non-toxic and commonly used in semiconductor manufacturing. The resulting transparent conducting film 120, 220 is also more robust than prior art transparent conducting films because the nanowires that form the network are less brittle and do not simply contact each other but rather are fused together as a result of the silicidation process and, thus, are subject to less resistance at the nanowire to nanowire interfaces. Consequently, the resulting structure of embodiments 100, 200 is optimal for incorporation into modern devices, such as flat panel displays, touch panels, solar cells, light emitting diodes (LEDs), organic optoelectronic devices, etc.

It should be understood that the terminology used herein is for the purpose of describing particular embodiments only and is not intended to be limiting of the embodiments. For example, the singular forms "a", "an" and "the" are intended to include the plural forms as well, unless the context clearly indicates otherwise. Additionally, the terms "comprises", "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof. It should further be understood that terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", "immediately adjacent to", etc., mean that at least one element physically contacts another element (without other elements separating the described elements). Finally, it should be understood that the corresponding structures, materials, acts, and equivalents of all means or step plus function elements in the claims below are intended to include any structure, material, or act for performing the function in combination with other claimed elements as specifically claimed. The above-description of the embodiments has been presented for purposes of illustration and description and it is not intended to be exhaustive. Many modifications and variations to the disclosed embodiments will be apparent to those of ordinary skill in the art without departing from the scope and spirit of those embodiments.

Therefore, disclosed above are embodiments of a structure with a metal silicide transparent conducting electrode, which is commercially viable, robust and safe to use (i.e., non-toxic) and, thus, optimal for incorporation into modern devices, such as flat panel displays, touch panels, solar cells, light emitting diodes (LEDs), organic optoelectronic devices, etc. Specifically, the structure can comprise a substrate (e.g., a glass or plastic substrate) and a transparent conducting film (i.e., a transparent conducting electrode) on that substrate. The transparent conducting film can be made up of a metal silicide nanowire network. For example, in one embodiment, the metal silicide nanowire network can comprise multiple metal silicide nanowires fused together in a disorderly arrangement on the substrate. In another embodiment, the metal silicide nanowire network can comprise multiple metal silicide nanowires fused together in a patterned grid on the substrate. Also disclosed herein are various different method embodiments for forming such a structure.

What is claimed is:

1. A structure comprising:
   a substrate;
   a transparent conducting film on said substrate, said transparent conducting film comprising a metal silicide nanowire network comprising metal silicide nanowires,
      said metal silicide nanowires comprising at least some intersecting metal silicide nanowires with interfaces between said intersecting metal silicide nanowires being physically fused together,
      said metal silicide nanowires comprising multiple types of metal silicide nanowires made from different silicided metal or metal alloy; and
   a transparent polymer layer coating said metal silicide nanowire network,
      said transparent polymer layer comprising a conductive layer.

2. The structure of claim 1, said transparent polymer layer filling any gaps within said metal silicide nanowire network.

3. The structure of claim 1, said transparent polymer layer comprising a non-conductive polymer layer containing conductive particles.

4. The structure of claim 1, said metal silicide nanowires comprising any of nickel (Ni) silicide nanowires, cobalt (Co) silicide nanowires, tungsten (W) silicide nanowires, chromium (Cr) silicide nanowires, platinum (Pt) silicide nanowires, titanium (Ti) silicide nanowires, molybdenum (Mo) silicide nanowires and palladium (Pd) silicide nanowires.

5. The structure of claim 1, said metal silicide nanowires being in any one of the following:
   a disorderly arrangement on said substrate; and
   in a grid on said substrate.

6. A structure comprising:
   a substrate; and
   a transparent conducting film on said substrate, said transparent conducting film comprising:
      a metal silicide nanowire network comprising metal silicide nanowires,
         said metal silicide nanowires being arranged on said substrate and comprising at least some intersecting metal silicide nanowires with interfaces between said intersecting metal silicide nanowires being physically fused together,
         said metal silicide nanowires comprising multiple types of metal silicide nanowires made from different silicided metal or metal alloy; and,
      a transparent polymer layer coating said metal silicide nanowire network, said transparent polymer layer containing metal particles.

7. The structure of claim 6, said transparent polymer layer filling any gaps within said metal silicide nanowire network.

8. The structure of claim 6, said metal silicide nanowires comprising any of nickel (Ni) silicide nanowires, cobalt (Co) silicide nanowires, tungsten (W) silicide nanowires, chromium (Cr) silicide nanowires, platinum (Pt) silicide nanowires, titanium (Ti) silicide nanowires, molybdenum (Mo) silicide nanowires and palladium (Pd) silicide nanowires.

9. The structure of claim 6, said metal silicide nanowires being in any one of the following:
   a disorderly arrangement on said substrate; and
   in a grid on said substrate.

10. A structure comprising:
    a substrate;
    a transparent conducting film on said substrate, said transparent conducting film comprising a metal silicide nanowire network comprising metal silicide nanowires made from different silicided metal or metal alloy; and
    a transparent polymer layer coating said metal silicide nanowire network,
    said transparent polymer layer comprising a conductive layer,
    said metal silicide nanowires comprising at least some intersecting metal silicide nanowires with interfaces between said intersecting metal silicide nanowires being physically fused together, and
    said metal silicide nanowires further comprising at least two different types of silicided metal or metal alloy.

11. The structure of claim 10, said transparent polymer layer filling any gaps within said metal silicide nanowire network.

12. The structure of claim 10, said transparent polymer layer comprising a non-conductive polymer layer containing conductive particles.

13. The structure of claim 12, said conductive particles comprising metal particles.

14. The structure of claim 10, said different types of metal silicide nanowires comprising any of nickel (Ni) silicide nanowires, cobalt (Co) silicide nanowires, tungsten (W) silicide nanowires, chromium (Cr) silicide nanowires, platinum (Pt) silicide nanowires, titanium (Ti) silicide nanowires, molybdenum (Mo) silicide nanowires and palladium (Pd) silicide nanowires.

15. The structure of claim 10, said metal silicide nanowires being in any one of the following:
    a disorderly arrangement on said substrate; and
    in a grid on said substrate.

* * * * *